(12) United States Patent
Suzuki

(10) Patent No.: US 7,285,484 B2
(45) Date of Patent: Oct. 23, 2007

(54) SEMICONDUCTOR DEVICE MANUFACTURING METHOD

(75) Inventor: Satoshi Suzuki, Suwa (JP)

(73) Assignee: Seiko Epson Corporation (JP)

( * ) Notice: Subject to any disclaimer, the term of this patent is extended or adjusted under 35 U.S.C. 154(b) by 166 days.

(21) Appl. No.: 11/256,597

(22) Filed: Oct. 21, 2005

(65) Prior Publication Data

US 2006/0099784 A1    May 11, 2006

(30) Foreign Application Priority Data

Nov. 9, 2004   (JP)   ............... 2004-325070

(51) Int. Cl.
H01L 21/3205  (2006.01)
(52) U.S. Cl. .................... 438/585; 438/299
(58) Field of Classification Search ........... 438/585, 438/299
See application file for complete search history.

(56) References Cited

U.S. PATENT DOCUMENTS

| | | |
|---|---|---|
| 5,429,956 A | 7/1995 | Shell et al. |
| 5,866,471 A | 2/1999 | Beppu et al. |
| 6,599,785 B2 | 7/2003 | Hamada et al. |
| 6,656,804 B2 | 12/2003 | Tsujikawa et al. |
| 6,713,357 B1 | 3/2004 | Wang et al. |
| 6,849,513 B2 | 2/2005 | Tsujikawa et al. |
| 6,979,603 B2 | 12/2005 | Hamada et al. |
| 7,163,848 B2 | 1/2007 | Yamazaki et al. |
| 7,179,733 B2 | 2/2007 | Sato et al. |
| 7,218,361 B2 | 5/2007 | Yamazaki et al. |
| 2002/0068394 A1 | 6/2002 | Tokushige et al. |
| 2002/0142549 A1 | 10/2002 | Miwa |
| 2003/0045131 A1 | 3/2003 | Verbeke et al. |
| 2004/0087068 A1 | 5/2004 | Yudasaka |
| 2004/0209190 A1 | 10/2004 | Mori et al. |
| 2006/0099784 A1* | 5/2006 | Suzuki ............... 438/585 |
| 2006/0289865 A1 | 12/2006 | Hamada et al. |
| 2007/0102713 A1 | 5/2007 | Yamazaki et al. |

(Continued)

FOREIGN PATENT DOCUMENTS

CN   1531061   9/2004

(Continued)

OTHER PUBLICATIONS

Homma, T. et al, "A selective SiO2 film-formation technology using liquid-phase deposition for fully planarized multilevel interconnections", Journal of the Electrochemical Society, Electrochemical Society, vol. 140, No. 8, Aug. 1993.

(Continued)

Primary Examiner—Mark V. Prenty
(74) Attorney, Agent, or Firm—Harness, Dickey & Pierce, P.L.C.

(57) ABSTRACT

A semiconductor device manufacturing method is provided in which, in the dummy gate pattern formation process, the pattern formation process is simplified and costs are reduced. A semiconductor device manufacturing method including: forming a mask element on a substrate; patterning the mask element into a prescribed shape, and forming a depression in the mask element; placing a functional liquid in the depression; drying the functional liquid placed in the depression so as to form a functional film; annealing the functional film; and, removing the mask element so as to form a dummy gate pattern of a residue of the functional liquid.

5 Claims, 2 Drawing Sheets

U.S. PATENT DOCUMENTS

2007/0138480 A1    6/2007    Yamazaki et al.

FOREIGN PATENT DOCUMENTS

| | | |
|---|---|---|
| EP | 1 345 261 | 9/2003 |
| JP | 11-262720 | 9/1999 |
| JP | 2001-308323 | 11/2001 |
| JP | 2002-170953 | 6/2002 |
| JP | 2002-289840 | 10/2002 |
| JP | 2004-241751 | 8/2004 |
| KR | 10-0485103 | 4/2005 |
| TW | 504846 | 10/2002 |
| TW | 513753 | 12/2002 |
| TW | 533461 | 5/2003 |
| TW | 533489 | 5/2003 |
| WO | WO 02/052627 A1 | 7/2002 |

OTHER PUBLICATIONS

Communication from European Patent Office re: related application, Jun. 2006.

* cited by examiner

SEMICONDUCTOR DEVICE MANUFACTURING METHOD

BACKGROUND OF THE INVENTION

1. Field of the Invention

This invention relates to a method of manufacture of a semiconductor device.

Priority is claimed on Japanese Patent Application No. 2004-325070, filed Nov. 9, 2004, the content of which is incorporated herein by reference.

2. Description of Related Art

LSI devices and other integrated circuits have been mounted in portable telephone sets, notebook-type personal computers, PDAs (Personal Digital Assistants), and other electronic equipment, in efforts to make electronic equipment more compact and provide sophisticated functions. Such LSI devices and other integrated circuits contain field effect transistors (MOSFETs), capacitors, resistors and similar, integrated and stacked on a semiconductor substrate.

However, trends toward greater compactness of electronic equipment in recent years have led to increased demands for smaller device components, and it has become increasingly necessary to reduce the film thickness of gate oxide films in MOSFETs. In light of such circumstances, it is anticipated that reduced gate oxide film thicknesses will give rise to problems of degradation of the reliability of the gate oxide film (TDDB degradation, increased leakage currents, reduced withstand voltages, and similar) in such processes as impurity doping using the gate electrode as a mask and plasma damage during gate electrode processing, and ion implantation into channel regions, source regions, and drain regions.

As one solution to such problems, a MOSFET formation method using a dummy gate pattern has been proposed (see for example Japanese Unexamined Patent Application, First Publication No. 2004-241751). This dummy gate pattern formation method is described briefly as follows. First, a dummy insulating film, which is a thin silicon oxide film, is formed on the silicon substrate surface. Next, a polysilicon film for use as a dummy gate pattern is formed on the dummy insulating film. Then, photolithography and etching are used to pattern the polysilicon film in the shape of the dummy gate pattern. Next, the dummy gate pattern is used as a mask to perform ion implantation of the silicon substrate with the dummy insulating film intervening, forming a channel region and source and drain regions. Then, the dummy gate pattern and pad oxide film are removed, and a trench portion is formed. A buried gate insulating film and gate electrode are formed in this trench portion.

In this method, after ion implantation using the dummy gate pattern as a mask, the dummy gate pattern and dummy insulating film are removed, and then a new gate insulating film and gate electrode are formed. By this means, plasma damage during gate electrode shaping, damage upon ion implantation into the channel region and source and drain regions, and other data to the newly formed gate insulating film and gate electrode can be avoided.

However, in the method disclosed in the above patent document, a plurality of processes, including formation of a dummy gate pattern oxide film, deposition of a polysilicon film, patterning of the polysilicon film, etching, and formation of a dummy gate pattern, are necessary in order to form the dummy gate pattern. Further, the polysilicon used as the material of the dummy gate pattern is generally expensive. Also, processing at high temperatures is required in order to pattern the polysilicon to the prescribed shape, so that large amounts of energy are necessary.

In addition, despite the fact that the dummy gate pattern requires these numerous processes, entails high costs, and requires large amounts of energy, the dummy insulating film and dummy gate pattern formed on the silicon substrate in the above disclosed patent document are removed from the substrate after ion implantation.

Hence in the case of a pattern which is ultimately removed, there is thought to be an urgent need for proposals of a method of formation of a dummy gate pattern which can be formed at low cost, and which can withstand the elevated temperature and other conditions of ion implantation processes even when formed at low cost.

SUMMARY OF THE INVENTION

This invention was devised in light of the above problems, and has as an object the provision of a semiconductor device manufacturing method which incurs low costs in the dummy gate pattern formation process, and simplifies the dummy gate pattern formation process.

In order to resolve the above problems, this invention is characterized in having forming a mask element on a substrate; patterning the mask element into a prescribed shape, and forming a depression in the mask element; placing a functional liquid in the depression; drying the functional liquid placed in the depression so as to form a functional film; annealing the functional film; and, removing the mask element so as to form a dummy gate pattern of a residue of the functional liquid.

In a conventional dummy gate formation method, a plurality of processes, including dummy gate pattern oxide film formation, polysilicon film deposition, resist patterning, etching, resist removal, and dummy gate pattern formation, are necessary to form the dummy gate pattern.

In this invention, a dummy gate pattern is formed using novel processes completely different from conventional dummy gate pattern formation processes.

Specifically, a dummy gate pattern is formed by performing the processes of dummy gate pattern oxide film formation, mask element patterning, functional liquid application, functional liquid drying, functional film baking, and mask element removal. When compared with conventional methods, in this invention the mask element is patterned to form a depression, and functional liquid is placed directly into this depression to form a dummy gate pattern. Hence there is no need to deposit a polysilicon film when forming a dummy gate pattern, as in the prior art. Moreover, the accompanying etching process to pattern the polysilicon into the prescribed shape can also be eliminated. Hence whereas in the prior art the dummy gate pattern removed after ion implantation incurred substantial manufacturing costs and time, by means of this invention a material generally less expensive than polysilicon can be used, so that costs can be reduced. Moreover, machining precision similar to that of the prior art can be employed to form a dummy gate pattern of the prescribed shape. Through simplification of manufacturing processes and consequent reduction of the types of manufacturing equipment required, plant design, including equipment, can be streamlined.

In this specification, "functional liquid" is a general term for a liquid having a prescribed function; such functions may be electrical or electronic functions (conductivity, insulating property, piezoelectricity, pyroelectricity, dielectric property, or similar); optical functions (selective light absorption, reflectivity, polarizing property, selective light transmissivity, nonlinear optical properties, fluorescence, phosphorescence or other luminescence, photochromism, or similar); magnetic functions (hard magnetic properties, soft magnetic properties, nonmagnetic properties, magnetic permeability, or similar); chemical functions (adsorption, desorption, catalysis, hydrophilic properties, ionic conduction, redox properties, electrochemical properties, electrochromic properties, or similar); mechanical functions (wear resistance or similar); thermal functions (thermal conductivity, thermal insulating properties, infrared emissive properties, or similar), biological functions (biocompatibility, antithrombotic properties); or similar.

It is desirable that in the semiconductor device manufacturing method of this invention, the functional liquid contain a compound which forms a siloxane bond or a polysilazane.

In this configuration, a functional liquid is used which contains a compound having a siloxane bond or a polysilazane, so that by subjecting the functional liquid to heat treatment or similar, a silicon oxide film can be formed as the dummy gate pattern.

Moreover, in general after performing ion implantation of the substrate using the dummy gate pattern as a mask, the substrate is subjected to heat treatment in order to cause the ions to diffuse in a prescribed region (in a prescribed depth direction or width direction) in the substrate. At this time, the temperature may for example be substantially 1000° C., and the substrate is treated in an elevated temperature state. In this invention, however, a functional liquid is used with a compound having a siloxane bond or with a polysilazane added. As a result, the functional liquid is resistant even to heat treatment at such elevated temperatures. Hence the dummy gate is resistant to the heat treatment used to promote ion diffusion, so that satisfactory ion implantation can be performed.

Further, it is desirable that in the semiconductor device manufacturing method of this invention, at least an upper surface of the mask element be subjected to liquid-repellency imparting treatment.

When placing the functional liquid in the depression formed in the mask element, if functional liquid remains on the mask element, there may be causes in which the mask element cannot be removed in the mask element removal stage due to the residue of the functional liquid. In this invention, the mask element is subjected to liquid-repellency imparting treatment, so that the functional liquid can be placed in the depression of the mask element without leaving functional liquid on the mask element, and consequently reductions in production yield can be avoided.

Further, it is desirable that the semiconductor device manufacturing method of this invention, further having: forming an insulating layer on the substrate so as to cover the dummy gate pattern, after removing the mask element so as to form the dummy gate pattern; removing a portion of the insulating layer to expose the dummy gate pattern and flattening the insulating layer and the dummy gate pattern; removing the dummy gate pattern surrounded by the insulating layer by using etching treatment so as to form a depression in the insulating layer; and, forming a gate electrode within the depression with the gate insulating film intervening, wherein an etch rate for the dummy gate pattern is higher than an etch rate for the insulating layer.

For example, when using the damascene gate method or replacement method to remove the dummy gate pattern portion and form a depression, and then form a gate electrode, wiring and similar, the etch rate of the dummy gate pattern is higher than the etch rate of the insulating layer, so that only the dummy gate pattern can be selectively removed. As a result, a depression for formation of the gate electrode is formed in the insulating layer, and by placing a metal or similar in this depression, the gate electrode can be formed.

Further, it is desirable that in the semiconductor device manufacturing method of this invention, the insulating layer contain a carbon-doped silicon oxide, and that the dummy gate pattern consist of a silicon oxide.

By means of this configuration, the insulating layer is formed using a carbon-doped silicon oxide. The carbon-doped silicon oxide is a liquid-repellency, and repels etching fluid during etching, and therefore is resistant to etching fluid.

Consequently the etching selectivity (silicon oxide/carbon-doped silicon oxide film) is large, and the silicon oxide can be removed by selective etching.

DETAILED DESCRIPTION OF THE INVENTION

Figure 1A:
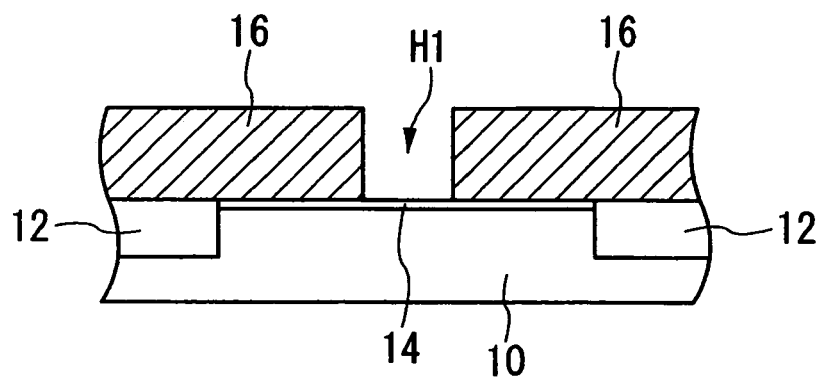
FIGS. 1A to 1D are cross-sectional views showing dummy gate pattern formation processes.

Below, aspects of the invention are explained, referring to the drawings.

In one aspect, processes to manufacture a MOSFET having an LDD structure are explained, referring to the drawings. First, the processes to form a dummy gate pattern for use as a mask, when implanting impurities into silicon substrate in a prescribed concentration, are explained in detail. In each of the drawings used in the following explanation, the scales of the various members have been modified appropriately to a size enabling visual identification of the members.

Method of Formation of Dummy Gate Pattern

FIGS. 1A to 1D are cross-sectional views showing the processes for formation of a dummy gate pattern in this aspect.

First, as shown in FIG. 1A, a device separation film 12 is formed, to provide electrical insulation between adjacent devices. Specifically, a reactive ion etching (RIE) method or similar is used to form a shallow trench portion in the silicon substrate 10. This trench portion is then buried by an insulating film, to form a device separation film 12 with a so-called STI (Shallow Trench Isolation) structure.

Next, the CVD method is used to form a first silicon oxide film 14 of prescribed film thickness over the entire surface of the silicon substrate 10, as shown in FIG. 1A.

Next, in the resist application process, resist 16 (mask element) is applied to the entire surface of the first silicon oxide film 14, as shown in FIG. 1A. Then, in the depression formation process, a photomask having an aperture portion in the region corresponding to the dummy gate pattern is used to expose the resist 16, transferring the prescribed pattern. In this aspect, positive-type resist is used, but a negative-type resist can also be used. Next, development of this exposure pattern is performed. In this way, a trench portion H1 corresponding to the dummy gate pattern, described below, is formed (FIG. 1A). This dummy gate pattern is formed as a substitute for the gate electrode, and the dummy gate pattern is used as a mask to perform ion implantation; hence it is desirable that the dummy gate pattern be formed so as to be equal to the gate width and length of the gate electrode, described below. In the depression formation process, there are cases in which resist 16 remains as a residue within the trench portion H1, and particularly on the bottom surface at which the silicon substrate 10 is exposed. In such cases, it is desirable that the bottom surface of the trench portion H1 be subjected to atmospheric-pressure plasma treatment, to perform ashing of the resist 16.

Figure 1B:
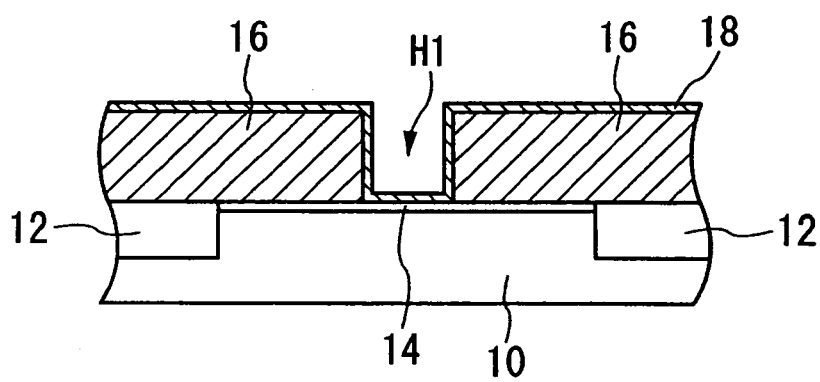

Next, in the liquid-repellency imparting treatment process, the entire surface of the resist 16, including the trench portion H1, is subjected to liquid-repellency imparting treatment, as shown in FIG. 1B. Specifically, the surface of the resist 16 applied to the entire surface of the silicon substrate 10, including the trench portion H1, is subjected to plasma treatment, using as the treatment gas $CF_4$, $SF_5$, $CHF_3$, or another fluoride gas. As shown in FIG. 1B, by means of this plasma treatment a liquid-repellency film 18 is formed on the surface of the resist 16, including the trench portion H1. In this aspect, liquid-repellency imparting treatment is performed on the substrate surface to form a liquid-repellency film 18; but in place of the resist 16, a bank material having liquid-repellency properties in advance can be used, and it is desirable that the liquid-repellency imparting treatment is performed only on the surface of the resist 16. As the method of performing liquid-repellency imparting treatment on the resist 16, a micro-contact printing method can also be employed. The above treatment gas is not limited to tetrafluoromethane, and another fluorocarbon gas can be used.

Further, it is desirable that a self-organizing film be formed, by for example using fluoroalkylsilanes (FAS) in the liquid-repellency imparting treatment, with each of the compounds arranged such that fluoro-alkyl groups are positioned on the surface of the resist 16. In this case also, liquid-repellency properties are imparted uniformly to the surface of the resist 16.

Examples of compounds formed by such a self-organizing film include heptadecafluro-1,1,2,2-tetrahydrodecyl triethoxysilane, heptadecafluro-1,1,2,2-tetrahydrodecyl trimethoxysilane, heptadecafluro-1,1,2,2-tetrahydrodecyl triechlorosilane, tridecafluoro-1,1,2,2-tetrahydrooctyl triethoxysilane, tridecafluoro-1,1,2,2-tetrahydrooctyl trimethoxysilane, tridecafluoro-1,1,2,2-tetrahydrooctyl triechlorosilane, trifluoropropyl trimethoxysilane, and other fluoroalkylsilanes (hereafter "FAS"). These compounds may be used individually, or two or more types may be combined. A self-organizing film consisting of organic polymer film is formed on a substrate by placing the substrate and the above starting-material compounds in a sealed container, and leaving the container at room temperature for substantially two to three days. This is a method of formation from the vapor phase; but self-organizing film can also be formed from the liquid phase. For example, the substrate may be immersed in a solvent containing the starting-material compound, then cleaned and dried, to form a self-organizing film on the substrate.

Figure 1C:
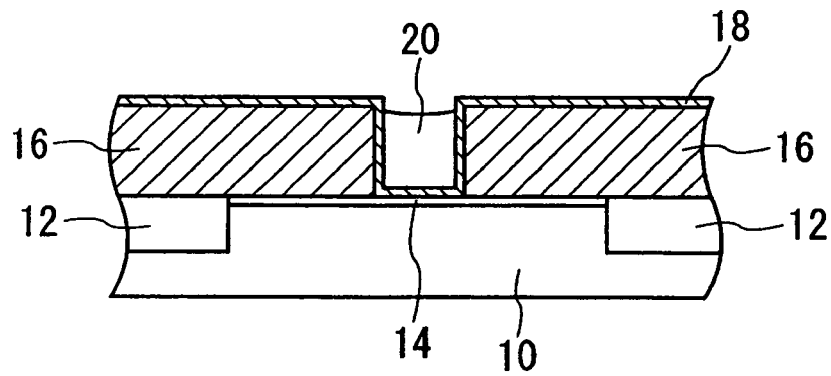

Next, in the functional liquid placement process as shown in FIG. 1C, the functional liquid is placed in the trench portion H1 shown in FIG. 1B. Below, the functional liquid placed in the trench portion H1 in this aspect is explained in detail. As the functional liquid used in this aspect, it is desirable that an inorganic polymer material having, as its basic structure, a siloxane bond, be dispersed in an organic solvent.

In this case, it is desirable that an alcohol or similar be used as the organic solvent in which the functional liquid is dispersed.

As another functional liquid, it is desirable that a polysilazane (a generic term for a polymer having an Si—N bond) dispersed in an organic solvent be used. One polysilazane is $[SiH_2NH]n$ (where n is a positive integer), called poly (perhydrosilazane). When the H in $[SiH_2NH]n$ are replaced with alkyl groups (for example methyl groups, ethyl groups, or similar), an organic polysilazane is obtained, and may be distinguished from inorganic polysilazanes. In this aspect, it is desirable that an inorganic polysilazane be used. In this case, it is desirable that xylene or similar be used as the organic solvent in which the functional liquid is dispersed. By including a polysilazane in the functional liquid, heat resistance in the annealing (baking) process described below is obtained.

As a functional liquid, it is also desirable that a silixon oxide film precursor, or minute particles of a silicon oxide film dispersed in an organic solvent, be used. The functional liquid is applied to the trench portion H1 formed in the resist 16 by for example the spin coating method. At this time, the top surface of the resist 16 is subjected to liquid-repellency imparting treatment. Consequently the functional liquid applied to the top surface of the resist 16 is imparted a liquid-repellency, and moreover centrifugal force acts, so that no functional liquid remains on the upper surface of the resist 16. On the other hand, the trench portion H1 is also subjected to liquid-repellency imparting treatment, similarly to the upper surface of the resist 16, but the functional liquid applied to the trench portion H1 does not escape to the outside from the trench portion H1, due to the barrier presented by the side walls of the trench portion H1. Thus functional liquid can be placed and remain in only the trench portion H1 formed in the resist 16. As the method used to place the functional liquid in the trench portion H1, in addition to spin coating, a slit coating method, dip coating method, spray coating method, printing method, ink jet method, or various other methods can be adopted.

Next, in the drying process, the functional liquid placed in the trench portion H1 is dried, as shown in FIG. 1C. Specifically, a heater or other heating mechanism is for example used to remove the organic solvent in the functional liquid. By this means, an insulating film (a dummy gate pattern, described below) consisting of a silicon oxide film is formed in the trench portion H1, as shown in FIG. 1C. Because the resist 16 is resistant to temperatures in the range 100° C. to 200° C., there is no occurrence of problems such as melting of the resist 16 in the drying process.

Next, in the annealing (baking) process, the insulating film (dummy gate pattern, described below) obtained by removing the organic solvent in the functional liquid, as shown in FIG. 1C, is annealed. Specifically, the treatment temperature is for example set in the range 350° C. to 450° C., and the insulating film is subjected to heat treatment for a prescribed length of time in an oxygen, nitrogen, or $H_2O$ environment at atmospheric pressure.

Figure 1D:
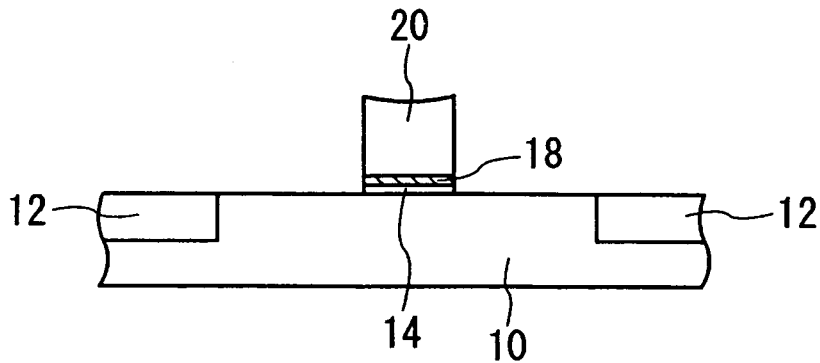

Then, as shown in FIG. 1D, the resist 16 is removed from on top of the silicon substrate 10. Specifically, the resist 16 applied in the n-MOS region is removed by light etching using HF or another etchant. The remaining resist 16 can also be subjected to ashing, by performing plasma treatment at atmospheric pressure.

In this way, a dummy gate pattern 20 consisting of a silicon oxide film (insulating film) is formed in the region in which a gate electrode, described below, is to be formed on the silicon substrate 10, as shown in FIG. 1D.

In this aspect, a dummy gate pattern 20 is formed using novel processes completely different from conventional dummy gate pattern formation processes.

Specifically, a dummy gate pattern 20 is formed by performing the processes of forming a dummy gate pattern oxide film 14, patterning resist 16, applying a functional liquid, drying the functional liquid, baking the functional film, and removing the resist 16. When compared with conventional methods, in this invention resist 16 is patterned to form a depression H1, and functional liquid is placed directly into this depression H1 to form a dummy gate pattern 20. Hence there is no need to use polysilicon when forming a dummy gate pattern 20, as in the prior art. Moreover, the accompanying etching process to pattern the polysilicon into the prescribed shape can also be eliminated. Hence whereas in the prior art the dummy gate pattern 20 removed after ion implantation incurred substantial manufacturing costs and time, by means of this invention a material generally less expensive than polysilicon can be used, so that costs can be reduced.

Moreover, machining precision similar to that of the prior art can be employed to form a dummy gate pattern of the prescribed shape. Through simplification of manufacturing processes and consequent reduction of the types of manufacturing equipment required, plant design, including equipment, can be streamlined.

Method of MOSFET Formation

Next, FIGS. 2A to 2E are used to explain a method of formation of a MOSFET having an LDD structure, using the above-described dummy gate pattern. Component elements common to the dummy gate pattern formation processes shown in FIG. 1 are assigned the same symbols, and detailed explanations are omitted.

Figure 2A:
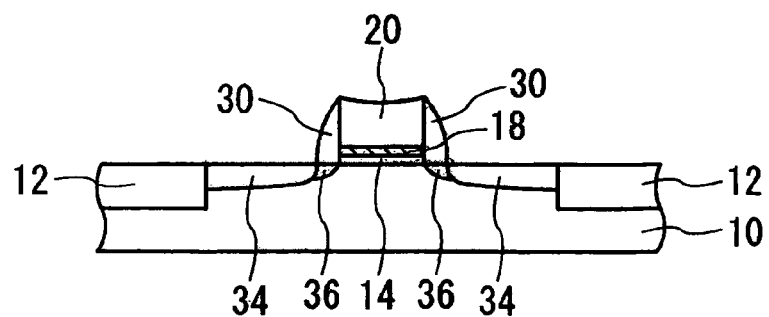
FIGS. 2A to 2E are cross-sectional views showing field effect transistor formation processes.
Figure 2B:
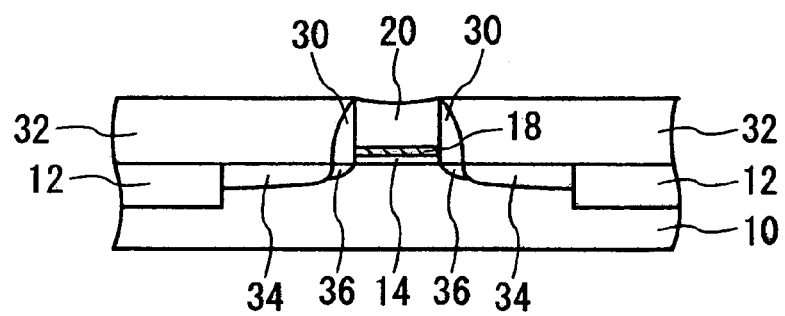

First, as shown in FIG. 2A, impurity ions (for example, phosphorus) are implanted at low concentration using a dummy gate pattern 20 as a mask in order to form a LDD (Lightly Doped Drain) structure, to form an n– type diffusion region in n– type silicon substrate 10.

Next, a silicon nitride film ($Si_3N_4$) or silicon oxide film is deposited on the entire surface of the n– type silicon substrate 10 so as to cover the dummy gate pattern 20. Then, RIE (Reactive Ion Etching) is used to perform etching. By means of this etching treatment, silicon nitride film ($Si_3N_4$ film) or silicon oxide film is left in the side walls of the dummy gate pattern 20, forming a tapered side wall insulating film 30 such as shown in FIG. 2A.

Next, impurity ions (for example arsenic (As+)) are implanted at high concentration using the dummy gate pattern 20 and side wall insulating film 30 as a mask, to form an n+ type diffusion region 34. An n– type diffusion region 36, which is a low-concentration impurity region, is formed directly below the side wall insulating film 30. By this means, a so-called LDD structure is obtained. Here, an LDD structure is adopted; but it is also desirable that an n– type diffusion region alone be formed, or that an n+ type diffusion region alone be formed, in a so-called single source/drain structure. It is also desirable that the depth and other dimensions of the impurity diffusion region be adjusted by performing heat treatment.

Next, CVD is used to deposit a carbon-doped silicon oxide film (SiOC) onto the entire surface of the n– type silicon substrate 10 so as to cover the dummy gate pattern 20. CMP (Chemical-Mechanical Polishing) is then used on the entire surface of the carbon-doped silicon oxide film thus deposited to polish the surface until the dummy gate pattern 20 is exposed, and the upper surface of the carbon-doped silicon oxide film is made flat. By this means, a first inter-layer insulating film 32 (insulating layer), consisting of carbon-doped silicon oxide film, is formed along the sidewall vicinity of the dummy gate pattern 20.

Figure 2C:
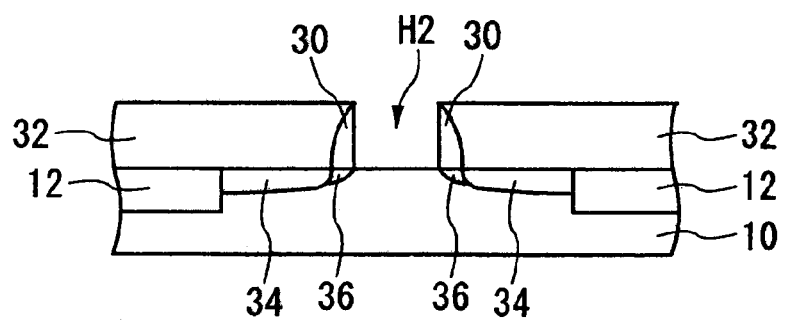

Next, wet etching is used to selectively remove a portion of the dummy gate pattern 20 formed so as to be surrounded by the first inter-layer insulating film 32, as shown in FIG. 2C, to form the trench portion H2.

Below, the wet etching process of this aspect is explained in detail.

Dilute hydrofluoric acid is used as the etchant. The dilute hydrofluoric acid is prepared by diluting 50% concentration hydrofluoric acid with water, so that the ratio of hydrofluoric acid to water is 1:99.

In this aspect, the first inter-layer insulating film 32 is formed as a carbon-doped silicon oxide film, and the dummy gate pattern 20 is formed as a silicon oxide film. Hence the first inter-layer insulating film 32 formed from the carbon-doped silicon oxide film has liquid-repellency properties, and repels the etchant, and so is resistant to the etchant of dilute hydrofluoric acid. Thus in the process shown in FIG. 2B, when the etchant is used to perform wet etching, the (silicon oxide film/carbon-doped silicon oxide film) selectivity is high, so that it is possible to selectively etch only the dummy gate pattern 20. Thus the dummy gate pattern 20 is removed as shown in FIG. 2C and a trench portion H2 for a gate electrode is formed in the first inter-layer insulating film 32.

Figure 2D:
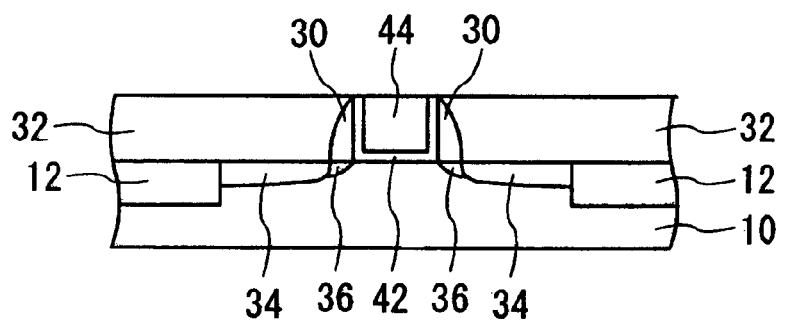

Next, as shown in FIG. 2D, CVD is used to deposit a silicon oxide film and a dielectric film (for example a $Ta_2O_5$ film) over the entire surface of the first inter-layer insulating film 32, including the trench portion H2. Then, photolithography is used to perform patterning in a prescribed shape, such that the silicon oxide film and similar remain only on the side faces and bottom face inside the trench portion H2. By this means, a gate insulating film 42 consisting of a silicon oxide film is formed on the side faces and bottom face of the trench portion H2.

When the gate insulating film 42 is a dielectric film, it is desirable that a thin silicon oxide film be formed at the interface, or that a nitride film be formed directly on the silicon surface using TP (a Rapid Thermal process) in an $NH_3$ gas atmosphere, so that interface energy levels and similar are not easily formed at the interface with the silicon.

Next, as shown in FIG. 2D, a conductive material such as a metal film (Ru film, TiN film, W film, tungsten nitride (WNx), or else a multilayer film combining these such as a W film plus TiN film) is deposited over the entire surface of the first inter-layer insulating film 32, so as to bury the trench portion H2. CMP is then used to polish the conductive material formed on top of the first inter-layer insulating film 32, so that conductive material remains only in the trench portion H2. By this means, a gate electrode 44 is formed on the gate insulating film 42 of the trench portion H2. Of course, when using as the gate insulating film a multilayer film which includes a CVD $SiO_2$ film, CVD SiON film, or a CVD $Si_3N_4$ film, it is desirable that a polycrystalline silicon film doped with impurities be used as the gate electrode.

Figure 2E:
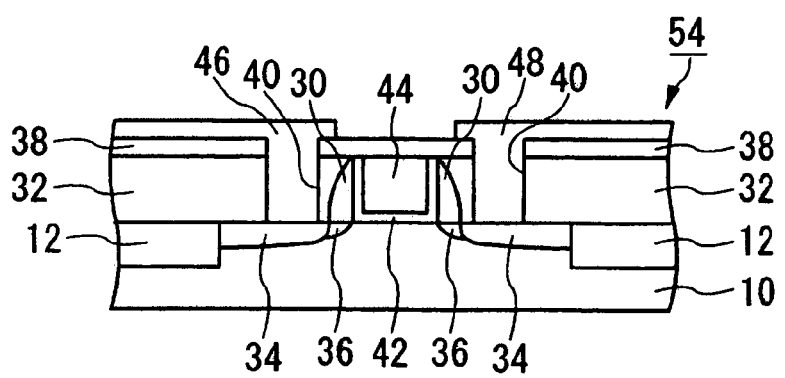

Next, as shown in FIG. 2E, a second inter-layer insulating film 38, which is a silicon oxide film, is deposited over the entire surface of the first inter-layer insulating film 32. Then, contact holes 40 for the source electrode 46 and drain electrode 48 are formed. Next, aluminum, which is a conductive material, is deposited over the entire surface of the second inter-layer insulating film. Photolithography is then used to pattern the aluminum layer into a prescribed shape, to form the source electrode 46 and drain electrode 48. At this time, the aluminum is packed into the contact holes 40 to electrically connect the source electrode 46 and source region 34 and to electrically connect the drain electrode 48 and drain region 34. In this way, a MOSFET 54 having an LDD structure is formed, as shown in FIG. 2E.

In this aspect, the damascene gate method or replacement method is used to remove the dummy gate pattern 20 formed so as to be surrounded by the first inter-layer insulating film 32, to form the trench portion H2, after which the gate electrode 44 is formed. By means of this aspect, the etch rate for the dummy gate pattern 20 is faster than the etch rate for the first inter-layer insulating film 32, so that it is possible to selectively etch and remove only the dummy gate pattern 20. As a result, by placing metal or polysilicon in the trench portion H2, a gate electrode 48 can be formed.

Further, in this aspect a functional liquid containing a compound which forms a siloxane bond or a polysilazane is used to form the dummy gate pattern 20. Consequently, when performing ion implantation using the dummy gate pattern 20 as a mask, or when using CVD to deposit the first inter-layer insulating film 32 or similar, the dummy gate pattern 20 is resistant to heat treatment. Hence ion implantation processes, CVD processes and similar can be performed satisfactorily.

Electronic Equipment

The above-described field effect transistor can be installed in various electronic equipment. For example, application is possible in portable telephones, liquid crystal projectors, personal computers (PCs) and engineering workstations (EWS) with multimedia support, pagers, word processors, television sets, viewfinder-type or direct-view camcorders, electronic organizers, desktop electronic calculators, car navigation equipment, POS terminals, devices equipped with touchscreens, and other electronic equipment.

The technical scope of this invention is not limited to the above-described aspects, but includes various modifications to the above-described aspects which do not deviate from the gist of the invention.

For example, it is desirable that the above liquid-repellency imparting treatment process be performed over the entire surface of the resist 16 before formation of the trench portion H1 in the resist 16. In an aspect above, the entire surface of the resist 16 was subjected to liquid-repellency imparting treatment; but it is also possible to place the functional liquid in the trench portion H1 without performing liquid-repellency imparting treatment. It is also desirable that liquid-repellency imparting treatment be performed only on the surface of the resist 16 excluding the trench portion H1.

The material used for the dummy gate pattern 20 and first inter-layer insulating film 32 is not limited to the materials described above, and various materials can be employed so long as the (first inter-layer insulating film 32/dummy gate pattern 20) selectivity is high.

In the above aspects, the first inter-layer insulating film 32 was formed as a single carbon-doped silicon oxide film (SiOC); in place of this, it is desirable that a two-layer structure be employed, in which a silicon oxide film is first formed, and then a carbon-doped silicon oxide film is formed. By this means, the surface of at least the first inter-layer insulating film 32 can be made a liquid-repellency, so that adequate selectivity with respect to the dummy gate pattern is obtained, and it is possible to selectively remove only the dummy gate pattern.

In this aspect, a case of application of the dummy gate pattern 20 to a MOS-type transistor was explained; of course application to a TFT (Thin Film Transistor) is also possible.

What is claimed is:

1. A semiconductor device manufacturing method comprising:
   forming a mask element on a substrate;
   patterning the mask element into a prescribed shape, and forming a depression in the mask element;
   placing a functional liquid in the depression;
   drying the functional liquid placed in the depression so as to form a functional film;
   annealing the functional film; and,
   removing the mask element so as to form a dummy gate pattern of a residue of the functional liquid.

2. The semiconductor device manufacturing method according to claim 1, wherein the functional liquid comprises a compound which forms a siloxane bond, or a polysilazane.

3. The semiconductor device manufacturing method according to claim 2, wherein at least an upper surface of the mask element is subjected to liquid-repellency imparting treatment.

4. The semiconductor device manufacturing method according to claim 1, further comprising:
   after removing the mask element so as to form the dummy gate pattern, forming an insulating layer on the substrate so as to cover the dummy gate pattern;
   removing a portion of the insulating layer to expose the dummy gate pattern and flattening the insulating layer and the dummy gate pattern;
   removing the dummy gate pattern surrounded by the insulating layer by using etching treatment so as to form a depression in the insulating layer; and,
   forming a gate electrode within the depression with the gate insulating film intervening, wherein
   an etch rate for the dummy gate pattern is higher than an etch rate for the insulating layer.

5. The semiconductor device manufacturing method according to claim 4, wherein the insulating layer comprises a carbon-doped silicon oxide, and the dummy gate pattern comprises a silicon oxide.

* * * * *